United States Patent [19]

Young

[11] Patent Number: 5,227,726
[45] Date of Patent: Jul. 13, 1993

[54] NUCLEAR MAGNETIC RESONANCE METHODS AND APPARATUS

[75] Inventor: Ian R. Young, Wiltshire, England

[73] Assignee: Picker International, Inc., Cleveland, Ohio

[21] Appl. No.: 796,523

[22] Filed: Nov. 21, 1991

[30] Foreign Application Priority Data

Nov. 21, 1990 [GB] United Kingdom ............... 9025344
Oct. 25, 1991 [GB] United Kingdom ............... 9122665

[51] Int. Cl.$^5$ ............................................. G01R 33/20
[52] U.S. Cl. ................................................ 324/309
[58] Field of Search ............. 324/300, 307, 308, 309, 324/310, 311, 312, 313, 314, 318, 322; 128/653.2, 653.5

[56] References Cited

U.S. PATENT DOCUMENTS

| | | | |
|---|---|---|---|
| 4,694,836 | 9/1987 | Buikman et al. | 128/653 |
| 4,719,424 | 1/1988 | Jimbo et al. | 324/309 |
| 4,721,912 | 1/1988 | Kaufman et al. | 324/309 |
| 4,728,890 | 3/1988 | Pattany et al. | 324/309 |
| 4,760,337 | 7/1988 | Young | 324/309 |
| 4,926,124 | 5/1990 | Le Roux | 324/309 |
| 4,937,526 | 6/1990 | Ehman et al. | 324/309 |
| 4,968,935 | 11/1990 | Ehman et al. | 324/309 |
| 4,973,906 | 11/1990 | Bernstein | 324/309 |
| 4,994,743 | 2/1991 | Glover et al. | 324/309 |
| 4,994,744 | 2/1991 | Glover et al. | 324/309 |
| 5,017,870 | 5/1991 | Kasugai et al. | 324/318 |
| 5,124,649 | 6/1992 | Denison et al. | 324/309 |

FOREIGN PATENT DOCUMENTS

| | | |
|---|---|---|
| 0228129 | 7/1987 | European Pat. Off. . |
| 0269147 | 6/1988 | European Pat. Off. . |
| 2161275 | 1/1986 | United Kingdom . |
| 2190502 | 11/1987 | United Kingdom . |
| 2206210 | 12/1988 | United Kingdom . |

*Primary Examiner*—Michael J. Tokar
*Attorney, Agent, or Firm*—Timothy B. Gurin

[57] ABSTRACT

In a magnetic resonance apparatus, motion artifacts in data obtained are reduced by transmitting, during data collection, an r.f. signal of known amplitude and of a frequency different from that of the spins excited for imaging, and utilizing a signal induced by that r.f. signal in a coil (45A, 45B) positioned adjacent the data signal detector means (10A, 10B) to effect an alteration of the signal produced by the detector means (10A, 10B) such as to reduce the motion artifacts.

8 Claims, 2 Drawing Sheets

NUCLEAR MAGNETIC RESONANCE METHODS AND APPARATUS

This invention relates to nuclear magnetic resonance (NMR) methods and apparatus. In such methods and apparatus movements of at least part of the body being examined may occur during the collection of NMR data with resultant motion artifacts in the data obtained.

In the case of magnetic resonance apparatus used for medical diagnostic purposes such movements typically comprise small random movements such as those caused by muscular twitching, as well as larger movements.

It is an object of the present invention to provide an NMR method and apparatus wherein such motion artifacts are reduced.

According to a first aspect of the present invention, there is provided an NMR method for examining region of a body wherein collection of imaging data is effected by exciting nuclear magnetic spins in said region and detecting said spins using detector means positioned adjacent said region; and motion artifacts in the data obtained are reduced by: transmitting during said collection of data, a radio frequency signal of known amplitude at a frequency different from that of said spins; and utilising a signal induced by said radio frequency signal in coil means which is positioned adjacent said detector means to effect an alteration of the signal produced by said detector means such as to reduce said motion artifacts.

According to a second aspect of the invention there is provided an NMR apparatus for examining region of a body comprising: means for collecting data comprising first RF transmitting means for applying an RF signal to said region so as to excite nuclear magnetic spins in said region and first RF coil means for detecting said nuclear magnetic spins; and means for reducing motion artifacts in said data comprising: second RF transmitting means for transmitting a second RF signal of known amplitude at a frequency different from that of said spins; second RF coil means positioned adjacent said first coil means; means for monitoring the signal induced in said second coil means by said second RF signal; and means for using an output of said monitoring means to effect an alteration of the output of said first coil means.

One method and apparatus in accordance with the invention will now be described by way of example with reference to the accompanying drawings in which.

The apparatus is for the most part of conventional form, for example, as described in UK Patent Specification No. 1,578,910 or No. 2,056,078, and is intended for use in examining the bodies of patients for diagnostic purposes, more especially for producing images for such purposes.

The basic elements of the apparatus are as follows:

The apparatus includes a first coil system whereby a magnetic field can be applied to a body to be examined in a given direction, normally designated the Z-direction, with a gradient in any one or more of the three orthogonal directions i.e. X, Y and Z directions.

Figure 1:
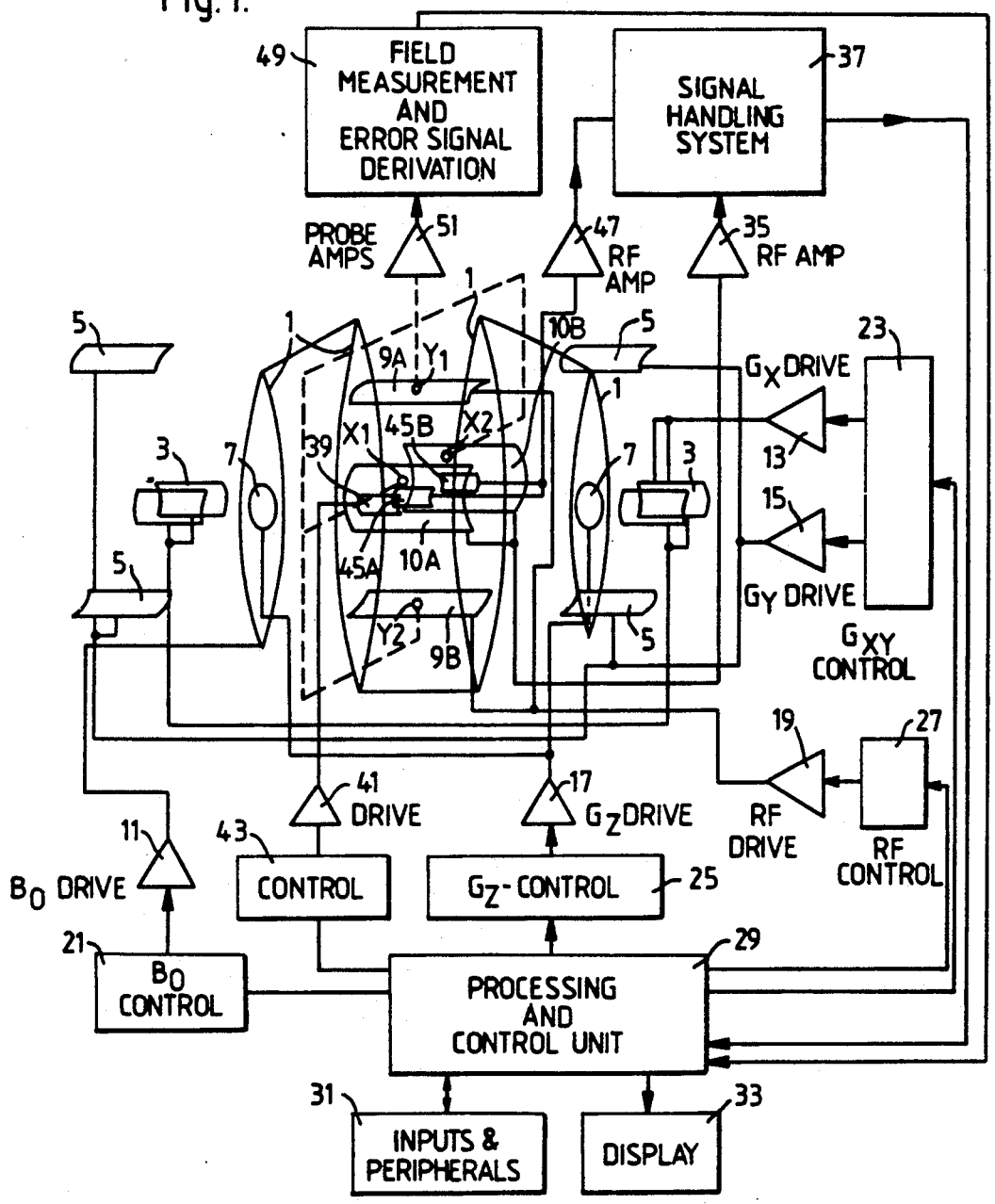
FIGS. 1 and 2 illustrate the apparatus diagrammatically.

Referring to FIG. 1, the first coil system comprises coils 1 which provide a steady uniform magnetic field Bo in the Z-direction; coils 3 which provide a magnetic field gradient Gx in the X-direction, coils 5 which provide a magnetic field gradient Gy in the Y-direction; and coils 7 which provide a magnetic field gradient Gz in the Z-direction.

In addition, the apparatus includes a second coil system whereby RF magnetic fields can be applied to the body under examination in a plane normal to the direction of the magnetic field produced by the first coil system, and whereby RF magnetic fields resulting from nuclei in the body under examination which have been excited to nuclear magnetic resonance with a spin vector component other than in the Z-direction can be detected.

The second coil system comprises a first coil arrangement comprising a pair of coils 9A and 9B for applying RF fields, and a second coil arrangement comprising coils 10A and 10B for detecting RF fields.

The various coils 1, 3, 5, 7 and 9A and 9B are driven by Bo, Gx, Gy, Gz and RF drive amplifiers 11, 13, 15, 17 and 19 respectively, controlled by Bo, Gxy, Gz and RF control circuits 21, 23, 25 and 27 respectively. These circuits may take various forms which are well known to those with experience of NMR equipment and other apparatus using coil induced magnetic fields.

The circuits 21, 23, 25 and 27 are controlled by a central processing and control unit 29 with which are associated inputs and other peripherals 31, for the provision of commands and instructions to the apparatus and a display 33.

The NMR signals detected by the coils 10A and 10B are applied via an amplifier 35 to a signal handling system 37. The signal handling system is arranged to make any appropriate calibration and correction of the signals, but essentially transmits the signals to the processing and control unit 29 wherein the signals are processed for application to the display to produce an image representing the distribution of an NMR quantity in the body being examined.

It will be appreciated that whilst shown separately to clarify the present description, the signal handling system 37 may conveniently form part of the unit 29.

The apparatus also includes a third coil system which is used, as described in detail below, for reducing motion artifacts in the images obtained in operation of the apparatus. This third coil system comprises an RF antenna coil 39 driven by a drive amplifier 41 controlled by a control circuit 43 which, in turn, is under control of the central processing and control unit 29. The third coil system further includes an RF detecting coil arrangement comprising two coils 45A and 45B positioned adjacent coils 10A and 10B respectively. Signals detected by coils 45A and 45B are applied via an amplifier 47 to the signal handling system 37 wherein they are utilised as described below.

Figure 2:
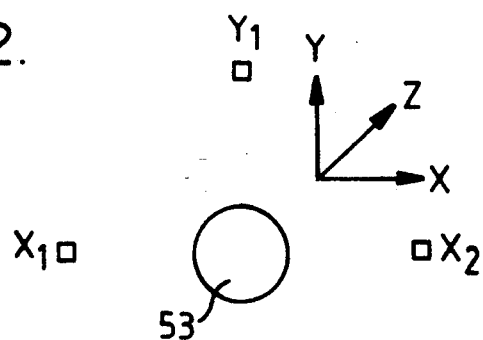

The apparatus further includes field measurement and error signal circuits 49 which receive signals via amplifiers 51 from field probes $X_1$, $X_2$, $Y_1$ and $Y_2$ which are disposed at suitable positions in relation to the body 53 being examined, as illustrated in FIG. 2, to monitor the applied magnetic fields.

Typical methods of using the apparatus to obtain an image of a selected slice of a body under examination will now be described with reference to FIG. 3.

The body to be examined is first positioned in the apparatus so that the region of the body containing the slice to be imaged is subject to the fields produced by the first and second coil systems.

The steady magnetic field Bo is then applied in the Z-direction by means of coils 1, this field serving to define an equilibrium axis of magnetic alignment in the region of the body being examined, i.e. along the Z-direction, and remaining constant throughout the examination procedure.

A magnetic field gradient is then applied in a direction normal to the slice to be imaged by means of coils 3, 5 or 7 as appropriate. For the purposes of the present example the slice is taken to lie in the X-Y plane so that the applied gradient is in the Z-direction and is thus denoted by Gz in FIG. 3. Whilst this gradient Gz is being applied an RF magnetic field pulse denoted B(90°) is applied. The frequency of the RF pulse is chosen to be at the Larmor frequency of chosen protons, typically hydrogen protons, in the slice of the body to be imaged. Since the strength of the magnetic field and hence the Larmor frequency of the chosen protons outside the slice differs from the frequency of the applied RF pulse, proton spins within the slice only are excited by the RF pulse. The integral of the RF pulse is such that the pulse is just sufficient to tip the spins of the excited protons through 90° i.e. in the present case from the Z-direction into the X-Y plane, the spins then precessing in the X-Y plane around the Z-axis.

Immediately after the gradient Gz a gradient $-Gz$ in the reverse direction is applied to rephase the spins in the selected slice against dephasing resulting from the gradient across the slice during excitation, as described for example in UK Patent Specification No. 1,578,910.

The above described procedure produces a free induction decay signal which may be detected by means of coils 10A and 10B. In order to obtain sufficient data to construct a two-dimensional image from the detected signal, the spins must also be encoded in known manner to enable signals arising from different parts of the slice to be distinguished from one another.

This is achieved by the application of further magnetic field gradients in the plane of the slice after excitation and before and/or during detection of the FID signal, the particular gradients used depending on the method to be employed to construct an image from the detected signals.

Figure 3:
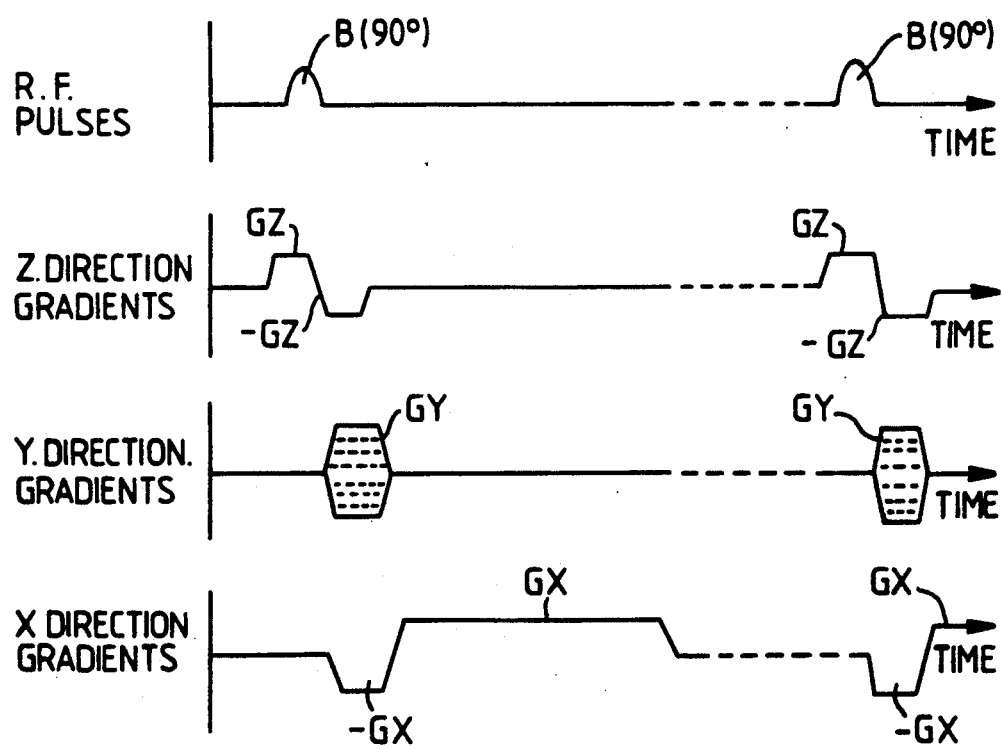
FIG. 3 illustrates a field sequence employed in the method.

For example, where a two-dimensional Fourier Transformation (2 DFT) technique is used to construct an image, the FID signal may be encoded by a phase encoding magnetic field gradient pulse Gy applied after excitation and before detection and a frequency encoding magnetic field gradient Gz applied during detection, as shown in FIG. 3. To obtain a full set of data for an image, the excitation and detection sequence is repeated a number of times with different values of the phase encoding gradient Gy. In order to avoid time shift of the FID signal by the applied frequency encoding gradient Gx, the gradient Gx is preceded by a reverse gradient $-Gx$ in known.

If a projection image construction technique is used, a frequency encoding gradient during detection only is employed and the detection sequence repeated for different directions of the encoding gradient in the slice.

In order to reduce motion artifacts due to major or minor movements of the body, e.g. as may result in change of the position of the body between one data collection sequence and another, movement of the body is monitored by the third coil system. This is achieved by exciting the antenna coil 39 during data collection with an RF signal of constant known amplitude of a frequency lying close to, but outside, the detection bandwidth of the coils 10A and 10B. The coils 45A and 45B are tuned to the frequency of the RF signal applied to the antenna coil 39.

The coupling between the antenna coil 39 and the coils 45A and 45B varies with the loading imposed on the coils 45A and 45B by the body being examined, and hence with movement of the body. Hence, any variations in the signals induced in the coils 45A and 45B by the RF signal radiated by the antenna coil 39 will reflect variations in the signals produced in the coils 10A and 10B by the free induction decay signals due to movement of the body being examined i.e. due to variations in the coupling between the coils 10A and 10B and the body due to movement of the body, and hence in the loading of the coils 10A and 10B, by the body.

Any variations in the amplitude of the signals produced by the coils 45A and 45B can thus be utilised by the signal handling system 37 to effect correction of the signals detected by coils 10A and 10B in such a manner as to reduce motion artifacts in the images obtained.

In alternative embodiments of the invention the signals produced by the coils 45A, 45B may be utilised to control the gain of the RF drive amplifier 19 and/or the RF drive amplifier 35.

By control of amplifier 19 it may be ensured that each applied RF pulse B(90°) accurately achieves a 90° tip of the spins of the excited protons despite variations in the loading of the RF coils 9A, 9B due to movement of the body being imaged. Similarly variation of the loading of the RF coils 10A, 10B due to movement of the body may be compensated by control of the drive amplifier 35.

Where the gain of amplifier 19 and/or amplifier 35 is controlled, the sensing by coils 45A, 45B of the signal transmitted by antenna coil 39 is suitably done at the beginning of each data collection sequence, i.e. before the application of each RF excitation pulse B(90°). Where the signals produced by coils 45A, 45B are used by the signal handling system 37 to effect the required compensation, the sensing by coils 45A, 45B can suitably be effected during actual occurrence of the free induction decay signals, and the required correction effected subsequently, i.e. by processing of stored free induction decay signals.

It will be appreciated that whilst a method and apparatus according to the invention will reduce motion artifacts arising due to body loading of the RF detector coils, other motion artifacts arise in NMR imaging which will require other techniques to reduce them. Hence a method according to the invention will normally be used in conjunction with such other techniques, for example, a technique for eliminating ghost images due to body movement such as described in UK Patent Specification No. 2,161,275 A.

I claim:

1. An NMR method for examining a region of a body wherein collection of data is effected by exciting nuclear magnetic spins in said region and detecting said spins using detector means positioned adjacent said region; and wherein motion artifacts in the data obtained are reduced by: transmitting during said collection of data, a radio frequency signal of known amplitude at a frequency different from that of said spins; and utilising a signal induced by said radio frequency signal in coil means which is positioned adjacent said detector means to effect an alteration of the signal produced by said detector means such as to reduce said motion artifacts.

2. A method according to claim 1 wherein said data is imaging data.

3. A method according to claim 1 wherein said radio frequency signal is of constant amplitude.

4. A method according to claim 3 wherein said data is imaging data.

5. An NMR apparatus for examining a region of a body comprising: means for collecting data comprising first RF transmitting means for applying an RF signal to said region so as to excite nuclear magnetic spins in said region and first RF coil means for detecting said nuclear magnetic spins; and means for reducing motion artifacts in said data comprising: second RF transmitting means for transmitting a second RF signal of known amplitude at a frequency different from that of said spins; second RF coil means positioned adjacent said first coil means; means for monitoring the signal induced in said second coil means by said second RF signal; and means for using an output of said monitoring means to effect an alteration of the output of said first coil means.

6. An apparatus according to claim 5 wherein said data is imaging data.

7. An apparatus according to claim 5 wherein said means for using comprises a signal handling system arranged to process signals representative of the detected spins in dependence on the output of said monitoring means.

8. An apparatus according to claim 7 wherein said data is imaging data.

* * * * *